United States Patent
Furuichi et al.

(10) Patent No.: US 6,813,102 B2
(45) Date of Patent: Nov. 2, 2004

(54) OPTICAL MODULE WITH A MONITOR PHOTO DIODE

(75) Inventors: Hiroaki Furuichi, Yokohama (JP); Kazumi Kawamoto, Yokohama (JP); Naoki Matsushima, Yokohama (JP)

(73) Assignee: OpNext Japan, Inc., Yokohama (JP)

(*) Notice: Subject to any disclaimer, the term of this patent is extended or adjusted under 35 U.S.C. 154(b) by 0 days.

(21) Appl. No.: 10/165,701

(22) Filed: Jun. 7, 2002

(65) Prior Publication Data

US 2003/0189770 A1 Oct. 9, 2003

(30) Foreign Application Priority Data

Apr. 8, 2002 (JP) ........................................ 2002-105148

(51) Int. Cl.[7] .............................. G02B 7/02; G02B 6/36; G02F 1/07; G02F 1/03; H01S 3/13
(52) U.S. Cl. ........................... 359/819; 385/88; 385/93
(58) Field of Search ................................ 359/819, 809, 359/811, 820, 344, 247, 127, 155; 385/88–89, 24, 92–93, 49, 33; 372/29, 36

(56) References Cited

U.S. PATENT DOCUMENTS

| | | | | |
|---|---|---|---|---|
| 4,293,826 A | * | 10/1981 | Scifres et al. | 372/44 |
| 4,771,434 A | * | 9/1988 | Yoshida et al. | 372/50 |
| 4,904,036 A | * | 2/1990 | Blonder | 385/14 |
| 5,499,312 A | * | 3/1996 | Hahn et al. | 385/91 |
| 5,557,116 A | * | 9/1996 | Masui et al. | 257/100 |
| 5,631,987 A | * | 5/1997 | Lasky et al. | 385/88 |
| 5,703,861 A | * | 12/1997 | Matsuda | 369/110.03 |
| 6,236,669 B1 | * | 5/2001 | Nakanishi et al. | 372/43 |
| 6,568,862 B2 | * | 5/2003 | Schulz et al. | 385/88 |

FOREIGN PATENT DOCUMENTS

| | | |
|---|---|---|
| EP | 0782224 A | 7/1997 |
| EP | 0836105 A | 4/1998 |
| JP | 6-289258 | 10/1994 |
| JP | 9-21929 | 1/1997 |
| JP | 9-222540 | 8/1997 |
| JP | 10-22578 A | 1/1998 |

* cited by examiner

Primary Examiner—Hung Xuan Dang
Assistant Examiner—Joseph Martinez
(74) Attorney, Agent, or Firm—Townsend and Townsend and Crew LLP

(57) ABSTRACT

A PD (20) is mounted to a position offset (23) as viewed in the direction orthogonal to the center of an optical axis (14) of backward light (13) of an LD (11) in such a manner that a light receiving plane (21) thereof becomes substantially parallel to the center of the optical axis. Alternatively, the PD (20) is mounted thereto so that the light receiving plane of the PD is inclined at angles ranging from about 0° to about 30° to the center of the optical axis of the backward light. Further, the PD whose side face on the LD side is inclined, is used to repeatedly reflect the backward light between the PD and an LD mounting substrate, after which the backward light is launched on the light receiving plane 21.

An optical module equipped with a PD for monitoring optical output power of an LD can be applied even to a junction up LD which reduces the number of parts, reduces even the number of connections by solder or the like and the number of electrical connections by wire bonding or the like, and makes no use of a base for the PD. Thus, low-cost PD mounting can be realized.

7 Claims, 5 Drawing Sheets

OPTICAL MODULE WITH A MONITOR PHOTO DIODE

BACKGROUND OF THE INVENTION

1. Field of the Invention

The present invention relates to an optical module with a monitor photo diode, and more specifically to an optical module which has built therein a semiconductor laser and a photo diode for monitoring optical output power of the semiconductor laser.

2. Description of the Related Art

An optical module used in long-distance communications through an optical fiber principally uses a semiconductor laser (hereinafter might be called an "LD" for short) as a light source. Since optical output power of an LD is apt to change under the influence of a temperature change under a use environment of an optical module and secular deterioration of the LD, the optical module often incorporates a photo diode (hereinafter might be called a "PD" for short) therein and has the function of monitoring the optical output power of the LD. In this case, a forward optical output of the LD is generally optically-coupled to the optical fiber so as to be used for optical communications, and a backward optical output thereof is received by the PD to thereby control a drive current of the LD so that the forward optical output power is held constant.

Several PD mounting methods have been proposed for the optical module having incorporated therein the PD for monitoring the optical output power of the LD in this way. As the most common simple method, a PD is fixed to a base (which might be called by a name such as a submount, a header or the like) for the PD by solder or the like, and thereafter the PD base is fixed and mounted to the rear of the LD by solder or the like. As references having described such a structure, there are known Laid-Open Patent Publications "Semiconductor Laser Device (Japanese Published Unexamined Patent Application No. Hei 6(1994)-289258)", "Optical Module (Japanese Published Unexamined Patent Application No. Hei 9(1997)-21929)", etc.

As a method free of the use of the PD base, there is known an example wherein a groove (channel) is formed in a substrate with an LD mounted thereon by etching or the like, backward light of the LD is introduced into and reflected by the groove, an incident plane of a PD is mounted on the same plane as a surface plane of the substrate with the LD mounted thereon, so as to be substantially orthogonal to the optical axis of the backward light, thereby receiving the reflected light. As a reference having described such a structure, there is known, for example, "Optical Subassembly Low in Height (Japanese Published Unexamined Patent Application No. Hei 9(1997)-222540)".

An advantage is brought about in that when a base for a PD is used, the PD can be mounted so that backward light of an LD is directly launched on the PD, relative to the spread of the backward light of the LD, whereby optical output power of the backward light can be detected with efficiency and the position to mount the PD can be determined freely in some measure. However, since the PD base is used, the number of parts is increased by one and hence the cost of each part increases. In addition, the number of connecting steps by solder or the like, and the number of electrical connections by wire bonding or the like are also respectively increased once. In the case of the solder-based connection in particular, temperature hierarchy of the solder is required to avoid re-melting of the previously-applied solder. Further, the degree of freedom of design on the solder's temperature hierarchy is reduced over the whole optical module.

Further, such a structure that the backward light is introduced into and reflected by the groove of the LD mounting substrate without using the base for the PD to thereby launch it into the PD, is of a junction down LD (whose light emitting point is located on the side of an LD mounting substrate, which is close to a solder connecting plane) and is suitable for use in the case where the distance between a light emitting point of the LD and a light introducing groove is short. In the case of a junction up LD (whose light emitting point is located on the closer side of a surface plane of an LD mounting substrate, which is located on the side opposite to a solder connecting plane), however, the distance from a light emitting point of the LD to a light introducing groove increases and the amount of light introducible into a monitor decreases. Therefore, the amount of light received by the PD might lack to monitor the optical output power of the LD.

SUMMARY OF THE INVENTION

One advantage of the present embodiment is providing an optical module with a monitor photo diode, which is capable of reducing the number of parts constituting the optical module and increasing the amount of light introducible into the monitor PD form a light emitting point of an LD without using a base for the PD.

Another advantage of the present embodiment is to provide an optical module with a monitor photo diode which is capable of achieving the advantage referred to above and is applicable even to a junction up LD.

In order to achieve the above advantages, the present embodiment provides an optical module having built therein a semiconductor laser and a photo diode for monitoring optical output power of light emitted from the semiconductor laser, wherein the photo diode is directed fixed to a substrate equipped with the semiconductor laser mounted thereon, and a light receiving plane of the photo diode is formed at a predetermined angle (which ranges from 0° to 60°) to the center of an optical axis of backward light of the semiconductor laser.

Now the substrate equipped with the semiconductor laser mounted thereon includes a case in which a semiconductor laser element is directly fixedly secured to a surface plane of the substrate, and a case in which it is fixedly secured to the surface plane of the substrate with a submount interposed therebetween. Either one of junction up and junction down may be used for the fixing of the photo diode and the semiconductor laser to the substrate. Further, the direct fixing includes a case in which the photo diode is soldered.

As preferred embodiments each provided with the predetermined angle, there are provided one wherein the photo diode is directly fixed to the substrate in such a manner that the light receiving plane of the photo diode is substantially parallel to the center of the optical axis of the backward light of the semiconductor laser and placed in the position where the light receiving plane has a predetermined offset with respect to the center of the optical axis of the backward light (there are additionally provided one wherein backward light is directly launched on its corresponding tight receiving plane and one wherein backward light is launched on its corresponding light receiving plane through the use of reflection of a side face of a photo diode, a surface plane of a substrate and faces of a groove formed in the substrate), one wherein a groove is formed in the substrate and the thickness of solder used to directly fix the photo diode to a groove internal face is controlled, one using an inclined face for defining a groove, and one wherein the thickness of a photo diode element is inclined.

These and other objects, features and advantages of the present invention will become more apparent in view of the following detailed description of the preferred embodiments in conjunction with the accompanying drawings.

DESCRIPTION OF THE PREFERRED EMBODIMENTS

Preferred embodiments of the present invention will hereinafter be described with reference to the accompanying drawings.

Figure 1:
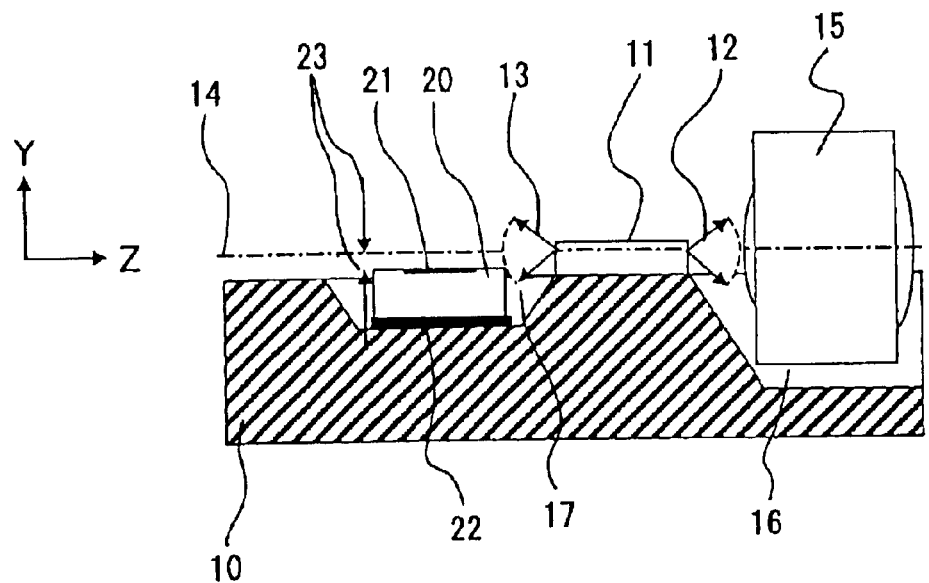
FIG. 1 is a cross-sectional view showing a configuration of a first embodiment of an optical module according to the present invention.

FIG. 1 is a cross-sectional view showing a configuration of a main portion of a first embodiment of an optical module according to the present invention. The present embodiment shows an optical module including a semiconductor laser and a photo diode for monitoring optical output power of light emitted from the semiconductor laser, both of which have been built therein. In the optical module, the photo diode is directly fixed to a substrate in such a manner that a light receiving plane of the photo diode is substantially parallel to the center of an optical axis of backward light of the semiconductor laser and placed in a position where it has a predetermined offset with respect to the center of the optical axis of the backward light.

A semiconductor laser 11 is fixed onto an Si substrate 10 used as a base. A front lens 15 is fixed by solder or an adhesive or the like in a groove 16 formed ahead (on the right side as viewed in the drawing) of the Si substrate 10 by anisotropic etching. Further, a photo diode 20 is directly fixed by a solder 22 in a groove 17 formed in the rear (on the left side as viewed in the drawing) of the Si substrate 10 by anisotropic etching. As to the fixing of the photo diode 20 on the groove 17 for the photo diode 20, the photo diode 20 is mounted (fixed) to a position where it has an offset 23 as viewed in the direction orthogonal to the center of an optical axis 14 of backward light of the semiconductor laser 11, in such a manner that a light receiving plane 21 of the photo diode 20 becomes substantially parallel to the center of the optical axis 14.

In the above structure, forward light 12 emitted from the LD 11 is converted into a beam by the front lens 15, which in turn is finally launched into an optical fiber (not shown) and transmitted therethrough. In order to stabilize the amount of the light 12, light 13 emitted to rearward of the LD 11 is received by the light receiving plane 21 of the PD 20. Now, a spread angle as viewed in the vertical direction (Y direction in FIG. 1), of the backward light 13 of the LD 11 normally ranges from about 30° to about 50° in a full width at half maximum. Therefore, when the offset 23 is slightly given to the optical axis 14 even if the PD 20 is mounted so that the light receiving plane thereof is placed substantially in parallel with the optical axis 14 of the backward light, the amount of light corresponding to a level necessary to control the amount of the forward light can be detected by the PD 20.

When, for example, the offset 23 is set so as to range from about 50 μm to about 100 μm in a full width at half maximum of the backward light 13 of the LD 11, which is in the neighborhood of 40°, and the amount of light is actually measured by a PD 20 having a light receiving plane 21 having a diameter of 300 μm, 10 to 15% or more (−10 dB to −8 dB and above as optical coupling efficiency) of the whole amount of backward light 13 can be received. Thus, it has been confirmed that this corresponds to a level free of any problem from a practical standpoint.

Incidentally, while the above embodiment has shown the example in which the grooves 16 and 17 on the Si substrate 10 are formed by anisotropic etching, grooves similar to these may be formed by dicing or the like. While the Si substrate is used as the base in the above embodiment, a ceramic substrate or the like may be used. Since the anisotropic etching cannot be adopted in this case, similar grooves are formed by dicing or the like.

Figure 2:
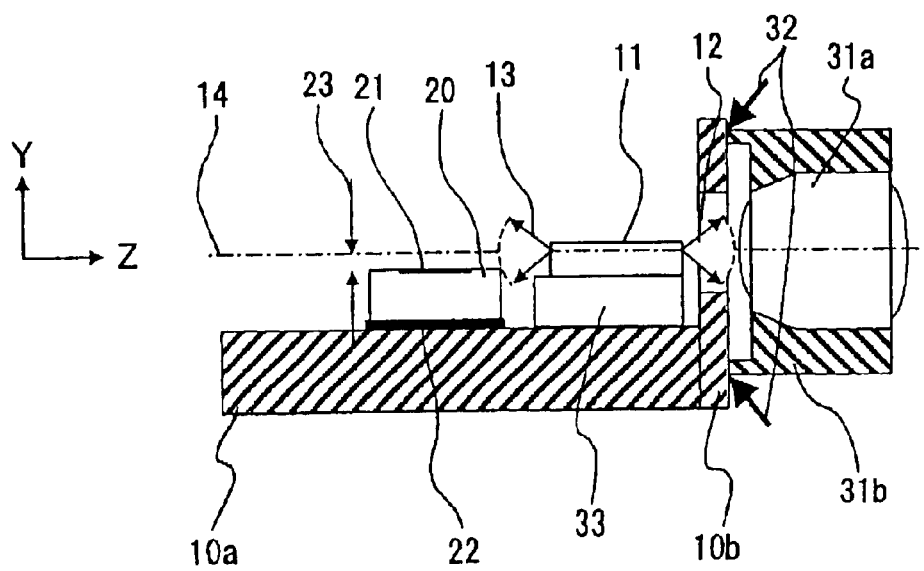
FIG. 2 is a cross-sectional view illustrating a configuration of a second embodiment of an optical module according to the present invention.

FIG. 2 is a cross-sectional view showing a configuration of a main portion of a second embodiment of an optical module according to the present invention. In the same drawing, component parts substantially identical to the component parts shown in FIG. 1 are respectively identified by the same reference numerals as their corresponding component parts shown in FIG. 1 (this is similar even in the case of other embodiments).

In the optical module according to the present embodiment, a semiconductor laser 11 is fixed onto a surface plane of a substrate 10a with an LD submount 33 interposed therebetween. Further, a photo diode 20 is directly fixed onto the surface plane of the substrate 10a by solder 22. A vertical substrate 10b having a bore formed therein in the vicinity of an optical axis is joined to the substrate 10a ahead on the right by brazing or the like. Further, a lens 31a mold-formed simultaneously with a metal holder 31b is aligned in X- and Y-axis directions with respect to forward light 12 of the LD 11 and weld-fixed by YAG laser spots 32.

As the substrate 10a, CuW or the like good in dissipation can be selected, whereas as the substrate 10b, an easy-to-laser-weld material such as 50-alloy of FeNi can be also selected. The LD 11 is soldered onto the LD submount 33.

A relationship of position among the forward light 12, backward light 13, the center of the optical axis 14, light receiving plane 21 and offset 23 of an optical system is similar to the first embodiment.

Figure 3:
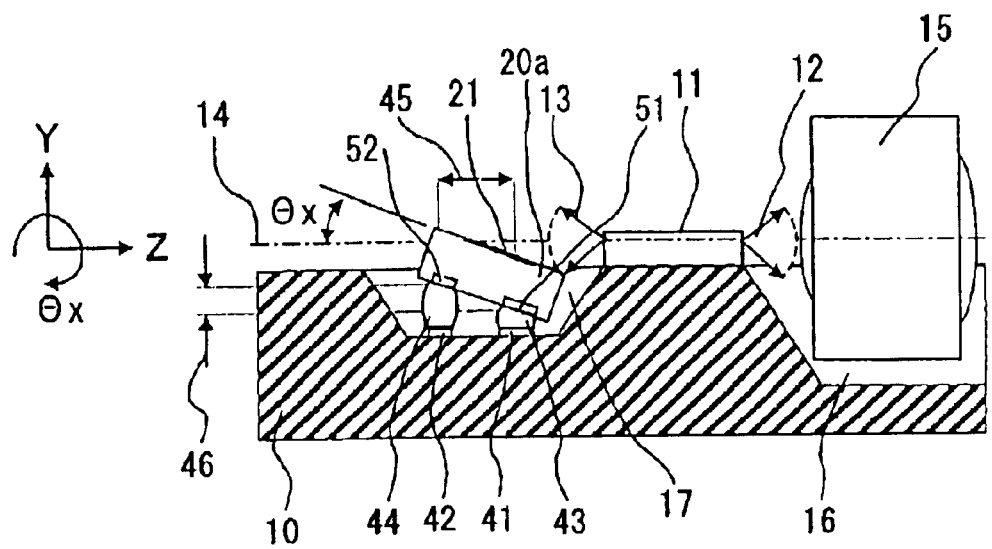
FIG. 3 is a cross-sectional view depicting a configuration of a third embodiment of an optical module according to the present invention.

FIG. 3 is a cross-sectional view showing a configuration of a main portion of a third embodiment of an optical module according to the present invention. The present embodiment is identical in configuration to the optical module shown in FIG. 1 except that a light receiving plane 21 of a photo diode 20a is inclined a predetermined angle θx alone toward the center of a lens's optical axis 14.

An LD 11 is fixed onto an Si substrate 10, and a lens 15 is fixed in a groove 16 ahead of the LD 11. In the present embodiment, the PD 20a is fixed in a groove 17 formed in the rear of the Si substrate 10 by anisotropic etching with an inclination of the angle θx alone, by means of solders 43 and 44 divided in an optical-axis direction (corresponding to a Z direction in FIG. 1). This is because the light receiving plane 21 of the PD 20a is mounted with being inclined an angle θx alone toward the optical axis 14 of backward light 13 as viewed from the vertical direction, thereby improving the efficiency of the amount of light received by the PD 20a with respect to the whole amount of the backward light 13 of the LD 11. In the case of actual measurements according to the embodiment of the present invention, an approximately twofold improvement in efficiency is obtained when θx=10° with respect to θx=0°, an approximately fourfold improvement in efficiency is obtained when θx=20° with respect to θx=0°, and an approximately sixfold improvement in efficiency is obtained when θx=30° with respect to θx=0°. Such a slight inclination of θx alone bears a great meaning.

An optimum range of the angle θx will now be described using FIGS. 9 and 10.

Figure 9:
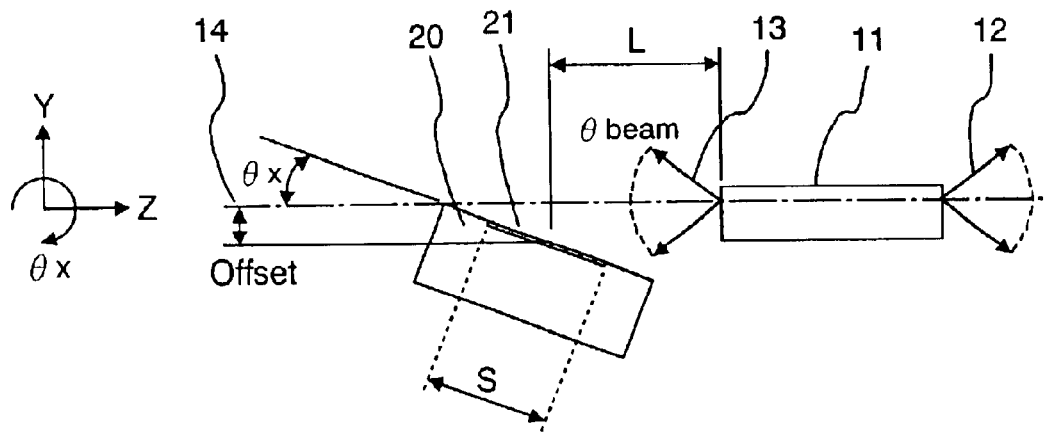
FIG. 9 is a cross-sectional view for describing the relationship of layout between parts for an optical module according to the present invention.

FIG. 9 is a cross-sectional view showing the relationship of layout between main parts of an optical module. FIG. 10 shows the relationship between an inclined angle θx of a PD and optical coupling efficiency. The efficiency of optical coupling between backward light 13 of an LD 11 and a PD 20 is principally determined according to the relationship of layout between a spread angle θbeam of the backward light 13 of the LD 11, a center distance L between the LD 11 and a light receiving plane 21 of the PD 20, and an area S of the light receiving plane 21.

On the other hand, a rough estimate about to which extent the optical coupling efficiency of a monitor PD is needed at the minimum, will be made. A forward output of an LD used for optical communications normally ranges from about 1 mW to about 10 mW, and a backward output thereof ranges from about 1/10 to about 1/5 thereof, i.e., 0.1 mW to 2 mW, particularly, about 0.2 mW to about 0.5 mW in many cases. There are often cases in which if the amount of light received by the monitor PD is about 0.05 mW or more, no problem occurs. Accordingly, the efficiency of optical coupling between the backward light of the LD and the monitor PD ranges from $^{0.05}/_{0.5}$ to $^{0.05}/_{0.2}$, i.e., about −10 dB to about −6 dB. If the efficiency falls within −5 dB, it is considered to show no problem in terms of practical utility.

When an LD and a PD used in practice are determined, the optical coupling efficiency reaches approximately 100%, i.e., an optical coupling efficiency of 0 dB in the neighborhood of θx=90° where L lying in such a location that the light receiving plane 21 is included within a range of the spread angle θbeam of the backward light 13, is set. However, there may often be cases in which a PD small in light-receiving area S is used from the viewpoint of cost, the center distance L between the LD and PD is increased in terms of ease of mounting, whereby the optical coupling efficiency is set so as to reach an optical coupling efficiency of about 50%, i.e., about −3 dB in the neighborhood of θx=90°.

Figure 10:
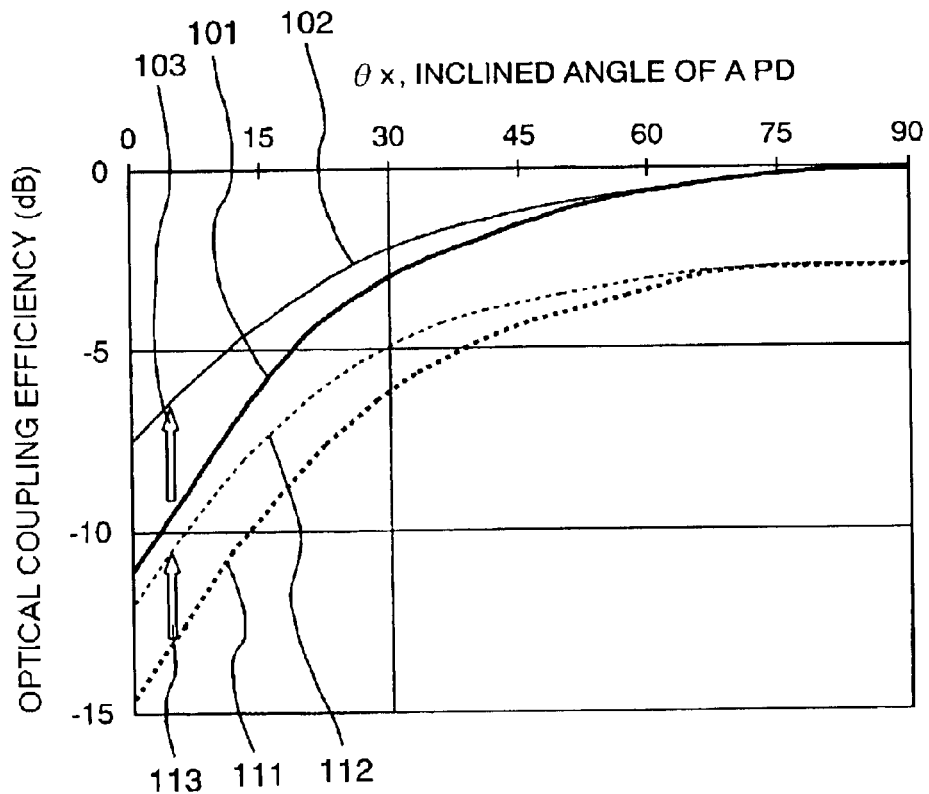
FIG. 10 is a diagram for describing optical coupling efficiency of the present invention.

In FIG. 10, a thick solid line 101 shows a case in which the coupling efficiency increases like about 0 dB in the neighborhood of θx=90°, and no offset is set to an optical axis 14. Further, a thin solid line 102 shows a case in which an offset is optimized and the coupling efficiency is improved like an efficiency improvement 103. It is understood that if the inclined angle θx of the PD is set to about 10° or more where the offset is optimized, and the angle θx is set to about 20° or more even in an offset-free case, the coupling efficiency falls within −5 dB.

In the case of the use of the PD small in light receiving area S as described above, a thick dotted line 111 shows a case in which the coupling efficiency decreases as about −3 dB in the neighborhood of θx=90°, and no offset is set to the optical axis 14, whereas a thin dotted line 112 shows a case in which the offset is optimized and the coupling efficiency is improved like an efficiency improvement 113. It is understood that if the inclined angle θx of the PD is set to about 30° or more when the offset is optimized, the coupling efficiency falls within −5 dB.

It is normally desirable that the inclined angle θx of the PD is set to near 0° in terms of packaging for a substrate. However, it can be said from the following points that it is desirable that θx is inclined within a range of about 0° to about 30° according to the required coupling efficiency of the monitor PD and the offset is optimized.

A method of mounting the PD with being inclined by the angle θx by means of the solders 43 and 44 will be described.

An area of a solder connecting metallized part 41 on the LD 11 side, which is within the groove 17 formed in the rear (on the left side as viewed in the drawing) of the Si substrate 10, is set large, whereas an area of a solder connecting metallized part 42 on the side opposite to the LD 11 is set small. Further, the same amounts of solder are supplied to their metallized parts and their peripheries by vapor deposition or punching or the like. On the other hand, an area of a solder connecting metallized part 51 on the PD 20a side is formed large in the same manner as the area of the metallized part 42, whereas an area of a metallized part 52 is formed small in the same manner as the area of the metallized part 42.

Next, the PD 20a is mounted to the position of its corresponding solder in association with the metallized part 51, and the solder is melted without any restraint on the PD 20a. Since the solder 44 in which the area of its corresponding metallized part is small, increases in height, and the solder 43 decreases in height, they are solidified in this state to form the inclination of the angle θx. Incidentally, when a distance 45 between the solders 44 and 43 is 400 μm, the difference 46 in height between the solders is 70 μm and the inclined angle θx=10°. Therefore, the configuration of the optical module can be easily realized.

Figure 4:
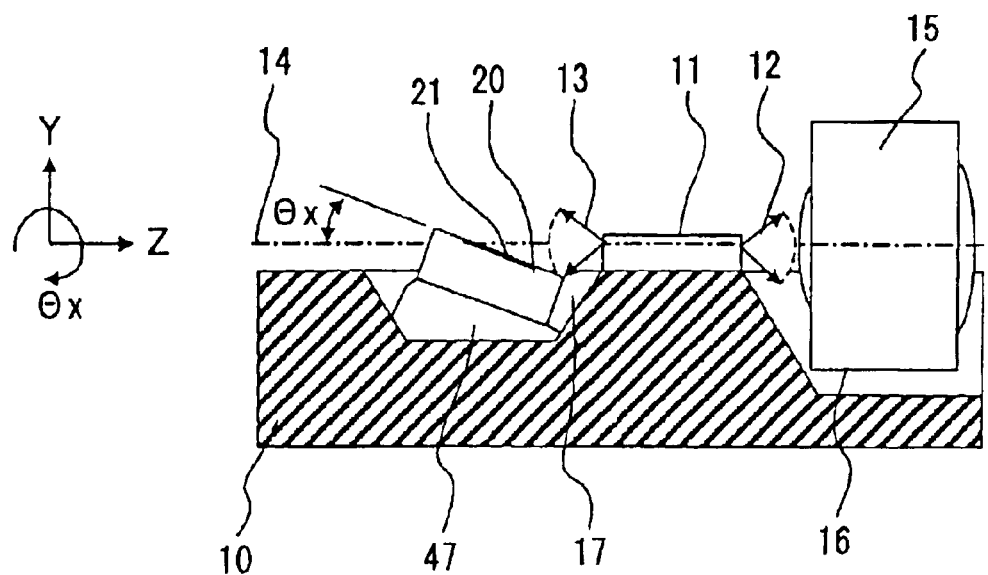
FIG. 4 is a cross-sectional view showing a configuration of a fourth embodiment of an optical module according to the present invention.

FIG. 4 is a cross-sectional view showing a configuration of a main portion of a fourth embodiment of an optical module according to the present invention. In the present embodiment, a light receiving plane 21 of a PD 20 is inclined only an angle θx toward an optical axis 14 of an LD 11. The present embodiment is similar in configuration to the embodiment shown in FIG. 3 except for a soldering portion of the PD 20.

A groove 17 formed in the rear of an Si substrate 10 is supplied with solder, and the PD 20 is mounted thereon in a restricted state with being inclined by θx. Then the solder 47 is melted and solidified to form an inclination of the angle θx to the optical axis 14.

Figure 5:
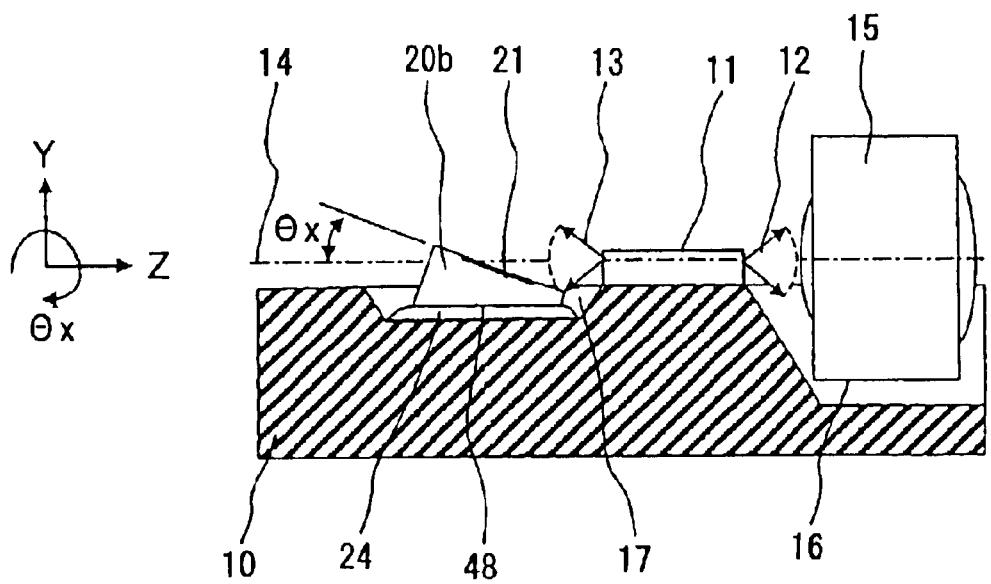
FIG. 5 is a cross-sectional view illustrating a configuration of a fifth embodiment of an optical module according to the present invention.

FIG. 5 is a cross-sectional view showing a configuration of a main portion of a fifth embodiment of an optical module according to the present invention. In the present embodiment, a light receiving plane 21 of a PD 20*b* is inclined only an angle θx toward an optical axis 14 of an LD 11. The present embodiment is similar in configuration to the embodiment shown in FIG. 3 except for a soldering portion of the PD 20*b*.

In the present embodiment, a solder connecting plane 24 of the PD 20*b* is set to a sectional shape cut diagonally in advance to allow the light receiving plane 21 to be inclined only the angle θx toward the optical axis. In other words, the thickness on the LD 11 side, of the PD 20*b* is formed thin and the thickness of its opposite side is formed thick. A groove 17 formed in the rear of an Si substrate 10 is supplied with solder, and the PD 20*b* is mounted thereon. Then the solder 48 is melted and solidified to form the inclined angle θx of the light receiving plane 21.

Figure 6:
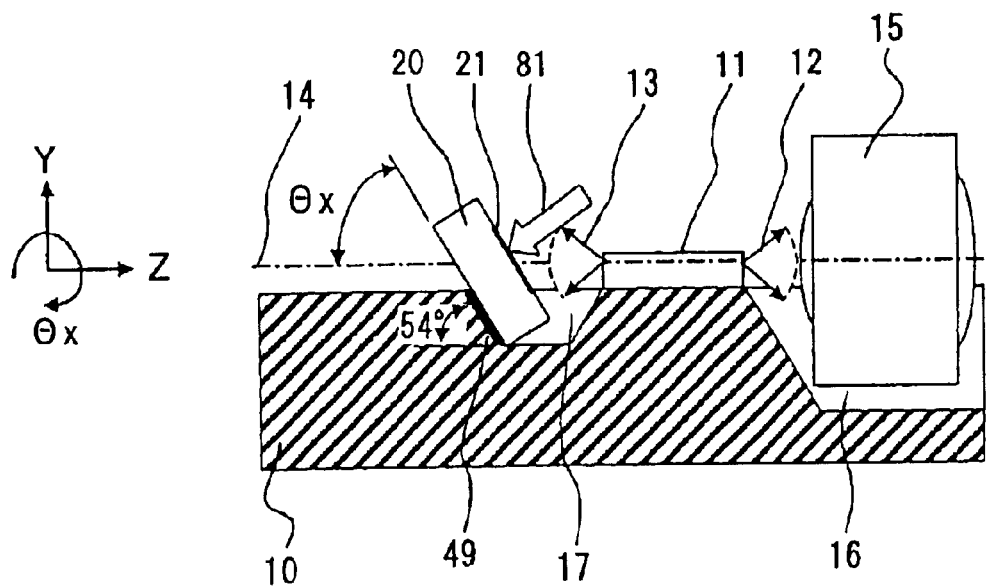
FIG. 6 is a cross-sectional view depicting a configuration of a sixth embodiment of an optical module according to the present invention.

FIG. 6 is a cross-sectional view showing a configuration of a main portion of a sixth embodiment of an optical module according to the present invention. In the present embodiment, a light receiving plane 21 of a PD 20 is inclined only an angle θx toward an optical axis of an LD. The present embodiment is similar to the embodiment shown in FIG. 3 in configuration except for a soldering portion of the PD 21.

A PD 20 is mounted on a slant face of a groove 17 formed in an Si substrate 10 at the rear (on the left side in the drawing) of an LD 11 by anisotropic etching in such a manner that the light receiving plane 21 of the PD 20 is inclined by the angle θx. Then a solder 49 is melted and solidified to form the inclination θx of the light receiving plane 21. Since an inclined angle of the slant face of the groove 17 formed by anisotropic etching is normally about 54°, the inclination θx also reaches approximately 54° and hence the efficiency of the amount of light received by the PD 20 with respect to the whole amount of backward light 13 of the LD 11 is improved. Since, however, the direction of mounting of the PD 20 on the slant face corresponds to a diagonal YZ direction 81 as described above, it is necessary to contrive its mounting method and the interval between the LD 11 and the PD 20. While the present embodiment shows the example in which the groove 17 is formed in the Si substrate 10 by anisotropic etching, a similar groove may be formed by dicing or the like.

Figure 7:
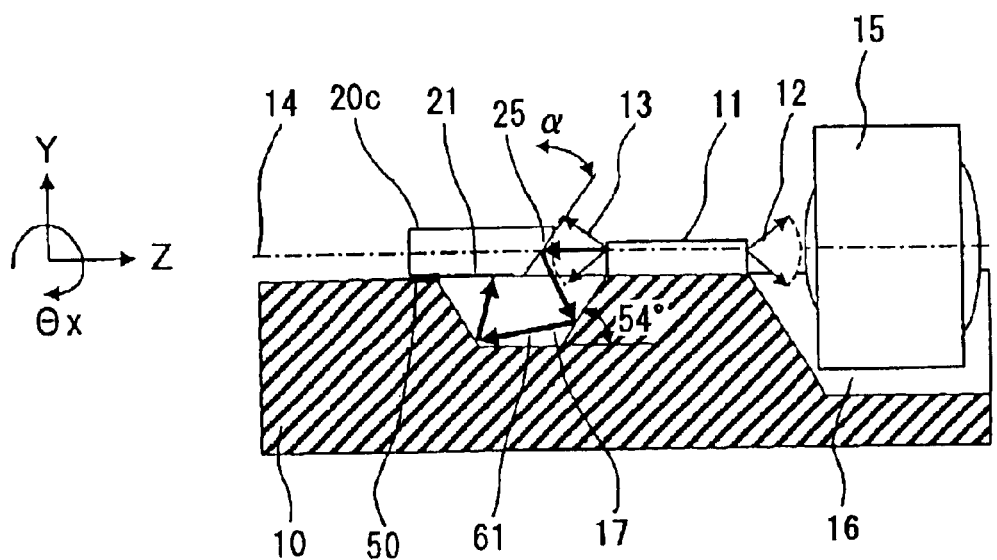
FIG. 7 is a cross-sectional view showing a configuration of a seventh embodiment of an optical module according to the present invention.

FIG. 7 is a cross-sectional view showing a configuration of a main portion of a seventh embodiment of an optical module according to the present invention. The present embodiment is one wherein reflection is used in constituent faces or planes of a PD and faces of a groove formed in a base substrate to thereby introduce backward light of an LD into its corresponding light receiving plane of the PD.

In the present embodiment, a groove 17 is formed on the LD side of a substrate 10 to which a junction up LD (whose light emitting point is located on the closer side of a surface plane of an LD mounting substrate, which is located on the side opposite to a solder connecting plane) 11 is fixedly secured. As to a PD 20*c* having a side face 25 inclined an angle α° toward a Y axis (in an upward direction as viewed in the sheet), part thereof is connected and fixed to the mounting substrate 10 by a solder 50 in such a manner that the side face 25 is opposed to a light emitting plane of the LD 11 and a light receiving plane 21 extends to the groove 17. A center beam of backward light 13 emitted from the LD 11 is repeatedly reflected like a reflection beam 61 by the inclined side face 25 of the PD 20*c* and respective faces of the groove 17, followed by launching on the light receiving plane 21 of the PD 20*c*. Owing to the present configuration, the present embodiment can be applied to an optical module based on both of a junction up LD and a junction down LD. Particularly when the junction up LD is configured, the distance from the light emitting point of the LD to the groove for light introduction can be shortened as compared with the conventionally known optical module, and a shortage of the amount of light received by the PD for monitoring optical output power of the LD can be resolved.

Figure 8:
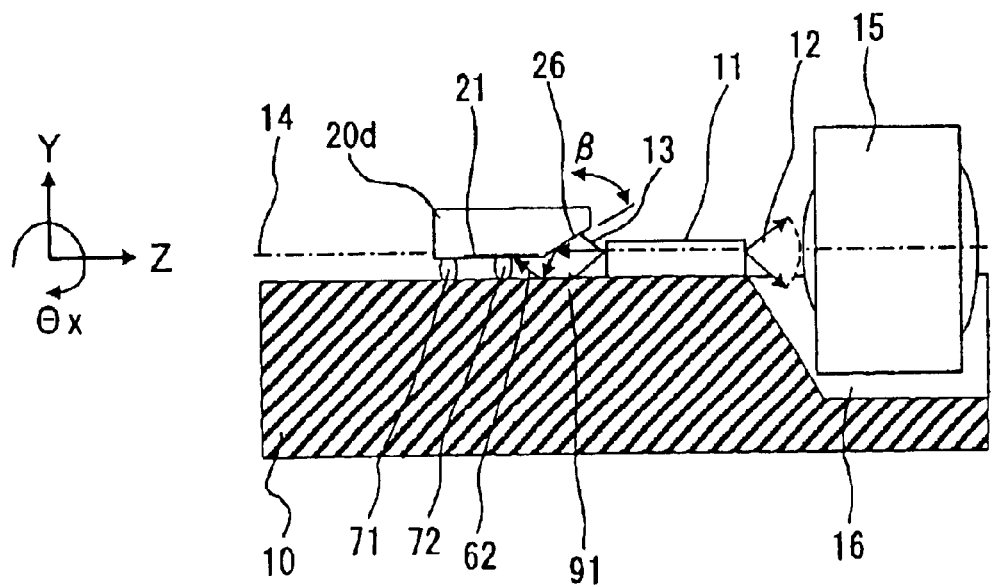
FIG. 8 is a cross-sectional view illustrating a configuration of an eighth embodiment of an optical module according to the present invention.

FIG. 8 is a cross-sectional view showing a configuration of a main portion of an eighth embodiment of an optical module according to the present invention. The present embodiment is another embodiment wherein reflection is used in constituent faces or planes of a PD and faces of a groove formed in a base substrate to thereby introduce backward light of an LD into its corresponding light receiving plane of the PD, and eliminates a groove used to form reflection surfaces or planes in an LD mounting substrate as compared with FIG. 7.

A side face on the LD side, of a PD 20*d* is formed by inclining at least part of an end face by an angle β° in advance as in an inclined side face 26 and polishing it. The PD 20*d* is connected and fixed by four solders 71, 72, 73 and 74 individually (since the solders 73 and 74 are on the inner sides of the solders 71 and 72 as viewed on the sheet, they are not shown in the drawing). The solders 71, 72, 73 and 74 connect a light receiving plane 21 of the PD 20*d* to a substrate surface place 91 by adjustments to the amount of solder in such a manner that a gap ranging from about several tens to 100 μm is formed from the substrate surface plane 91 as a gap lower in position than a light emitting point of an LD 11. A center beam of backward light 13 emitted from the LD 11 is repeatedly reflected like a reflection beam 62 by an inclined side face 26 of the PD 20*d* and the substrate surface plane 91, followed by launching on the light receiving plane 21 of the PD 20*d*. Owing to the present configuration, the present embodiment has an advantage that the groove for introducing the backward light into the LD mounting substrate and reflecting it thereby becomes unnecessary, and the number of manufacturing process steps is reduced.

According to the present invention, a method of mounting a PD for monitoring optical output power of an LD eliminates the need for the use of a base for the PD and thereby allows the number of parts to be reduced by one, thereby making it possible to reduce a part cost. A further advantage is obtained in that the number of connections by solder or the like, and the number of electrical connections by wire bonding or the like can also be reduced once respectively. An advantageous effect is also brought about in that since the number of connections by solder related to a PD is reduced once in the case of the solder connections in particular, the degree of freedom of design on temperature hierarchy for solder is enhanced over the whole optical module. A further advantageous effect is also brought about in that even in the case of a structure wherein backward light is introduced into and reflected from a groove formed in an LD mounting substrate without using a base for a PD, followed by launching on the PD, even a junction up LD in which the distance from a light emitting point of the LD to a light introducing groove is long, is capable of sufficiently ensuring the amount of introducible light as well as a junction down LD in which the distance from a light emitting point of the LD to a light introducing groove is short. According to the above, an optical module can be provided which is applicable even to the junction up LD without using the base for the PD and realizes a low cost PD mounting method.

While the present invention has been described above in conjunction with the preferred embodiments, one of skill in the art would be enabled by this disclosure to make various modifications to this embodiments and still be within the scope and spirit of the invention as formed in the appended claims.

What is claimed is:

1. An optical module comprising:

a semiconductor laser; and a photo diode for monitoring optical output power of light emitted from said semiconductor laser;

said semiconductor laser and said photo diode being built therein;

wherein said photo diode prepared separately from a substrate is directly mounted on a groove formed in the substrate equipped with said semiconductor laser by use of either one of junction up and junction down in such a manner that a light receiving plane of said photo diode is substantially parallel to the center of an optical axis of backward light of said semiconductor laser and placed in a position where the light receiving plane has a predetermined offset with respect to the center of the optical axis of the backward light.

2. The optical module according to claim 1, wherein said photo diode is directly mounted onto a surface plane of the substrate and the center of an optical axis of said semiconductor laser is placed so as to become higher than the light receiving plane of said photo diode.

3. The optical module of claim 1, wherein said semiconductor laser is configured for long-distance transmission.

4. An optical module according to claim 1, wherein said groove is a groove formed by etching.

5. An optical module according to claim 1, wherein said semiconductor laser has a junction up structure.

6. An optical module comprising:

a semiconductor laser; and a photo diode for monitoring optical output power of light emitted from said semiconductor laser;

said semiconductor laser and said photo diode being built therein;

wherein a side face of said photo diode has a slant face formed at a predetermined angle to the light receiving plane of said photo diode, an Si substrate to which said photo diode is fixed, has a groove formed by anisotropic etching, and said photo diode is directly fixed to the Si substrate so that the light receiving plane thereof extends to the groove, and backward light of said semiconductor laser falls on the slant face and the backward light reflected by the slant face is reflected by faces constituting the groove, followed by launching on the light receiving plane.

7. An optical module comprising:

a semiconductor laser; and a photo diode for monitoring optical output power of light emitted from said semiconductor laser;

said semiconductor laser and said photo diode being built therein;

wherein said photo diode includes a side face having a slant face formed at a predetermined angle to a light receiving plane thereof, and has the light receiving plane opposite to a surface plane of a substrate with a gap formed therebetween, and said photo diode is directly fixed to the substrate by a plurality of soldering portions in such a manner that back light emitted from said semiconductor laser falls on the slant face, the backward light reflected by the slant face is reflected by the surface plane of the substrate and falls on the light receiving plane through the gap.

* * * * *